United States Patent
Zhang et al.

(10) Patent No.: US 12,164,202 B2
(45) Date of Patent: Dec. 10, 2024

(54) DISPLAY PANEL, MANUFACTURING METHOD THEREOF, AND DISPLAY DEVICE

(71) Applicant: GUANGZHOU CHINA STAR OPTOELECTRONICS SEMICONDUCTOR DISPLAY TECHNOLOGY CO., LTD., Guangzhou (CN)

(72) Inventors: Yi Zhang, Guangzhou (CN); Shimin Ge, Guangzhou (CN)

(*) Notice: Subject to any disclaimer, the term of this patent is extended or adjusted under 35 U.S.C. 154(b) by 0 days.

(21) Appl. No.: 17/623,272

(22) PCT Filed: Dec. 22, 2021

(86) PCT No.: PCT/CN2021/140481
§ 371 (c)(1),
(2) Date: Dec. 28, 2021

(87) PCT Pub. No.: WO2023/108755
PCT Pub. Date: Jun. 22, 2023

(65) Prior Publication Data
US 2024/0036410 A1    Feb. 1, 2024

(30) Foreign Application Priority Data

Dec. 14, 2021  (CN) .......................... 202111529000.7

(51) Int. Cl.
*H01L 27/12*    (2006.01)
*G02F 1/1362*   (2006.01)
(Continued)

(52) U.S. Cl.
CPC ...... *G02F 1/136227* (2013.01); *G02F 1/1368* (2013.01); *H01L 27/1225* (2013.01);
(Continued)

(58) Field of Classification Search
CPC ............ G02F 1/136227; G02F 1/1368; G02F 1/133707; G02F 2201/40; H01L 27/1225; H01L 27/127
See application file for complete search history.

(56) References Cited

U.S. PATENT DOCUMENTS

2014/0139774 A1* 5/2014 Tsai ...................... H01L 27/124
257/43
2016/0111453 A1  4/2016 Lee et al.
(Continued)

FOREIGN PATENT DOCUMENTS

| CN | 1746756 A | 3/2006 |
|---|---|---|
| CN | 101354513 A | 1/2009 |

(Continued)

OTHER PUBLICATIONS

International Search Report in International application No. PCT/CN2021/140481, mailed on Aug. 25, 2022.
(Continued)

*Primary Examiner* — David Vu
*Assistant Examiner* — Brandon C Fox

(57) ABSTRACT

The present application discloses a display panel, a manufacturing method thereof, and a display device. The display panel includes a substrate; a gate layer; a gate insulating layer; an active layer; a source-drain layer including a source electrode and a drain electrode; a passivation layer provided with a contact hole; and a pixel electrode layer connected to the drain electrode through the contact hole; wherein a light-transmitting etch stop layer is disposed at a hole bottom of the contact hole, and the light-transmitting etch stop layer at least partially covers a hole bottom of the contact hole.

14 Claims, 10 Drawing Sheets

FIG. 7

(51) Int. Cl.
   *G02F 1/1368*  (2006.01)
   *G02F 1/1337*  (2006.01)

(52) U.S. Cl.
   CPC ...... *H01L 27/127* (2013.01); *G02F 1/133707* (2013.01); *G02F 2201/40* (2013.01)

(56) References Cited

U.S. PATENT DOCUMENTS

| | | | | |
|---|---|---|---|---|
| 2018/0151749 A1* | 5/2018 | Zhang | ................ | H01L 27/1225 |
| 2019/0296050 A1* | 9/2019 | Yoshida | .............. | H01L 27/1225 |

FOREIGN PATENT DOCUMENTS

| | | | |
|---|---|---|---|
| CN | 101750825 | A | 6/2010 |
| CN | 105047611 | A | 11/2015 |
| CN | 105826330 | A | 8/2016 |
| CN | 108028202 | A | 5/2018 |
| CN | 108039352 | A | 5/2018 |
| CN | 109659313 | A | 4/2019 |
| CN | 110299368 | A | 10/2019 |
| CN | 110473897 | A | 11/2019 |
| JP | H08203872 | A | 8/1996 |
| KR | 20080002194 | A | 1/2008 |

OTHER PUBLICATIONS

Written Opinion of the International Search Authority in International application No. PCT/CN2021/140481, mailed on Aug. 25, 2022.
Chinese Office Action issued in corresponding Chinese Patent Application No. 202111529000.7 dated Feb. 3, 2023, pp. 1-7.

* cited by examiner providing a substrate, wherein a gate layer, a gate insulating layer, an active layer, an etch stop layer, and a source-drain layer are sequentially formed on the substrate, and the source-drain layer comprises a source electrode and a drain electrode; ⸺ S10 forming a passivation layer on the source-drain layer, wherein the passivation layer is formed with a contact hole, and a hole bottom of the contact hole is at least partially covered by the etch stop layer; and ⸺ S20 forming a pixel electrode layer on the passivation layer, wherein the pixel electrode layer is connected to the drain electrode and the etch stop layer through the contact hole. ⸺ S30

FIG. 9

DISPLAY PANEL, MANUFACTURING METHOD THEREOF, AND DISPLAY DEVICE

BACKGROUND OF INVENTION

Field of Invention

The present application relates to a field of display, and in particular to a display panel, a manufacturing method thereof, and a display device.

Description of Prior Art

Aperture ratio is one of important parameters of liquid crystal display panels. At present, the aperture ratio can be increased mainly by reducing an area of the metal layer in the display panel, because the presence of the metal layer affects deflection of liquid crystals, resulting in light leakage in the liquid crystal display panel. In order to prevent light leakage, it is necessary to fabricate a black matrix above the metal layer to shield light, and an increase in the area of the black matrix will inevitably lead to a loss of the aperture ratio.

At present, some designs have been adopted to increase the aperture ratio by reducing an area of the drain electrode. In these designs, the drain electrode cannot completely cover a hole bottom of a contact hole of a passivation layer, so that the passivation layer is in direct contact with an underlying insulating layer. When the passivation layer is etched, a certain degree of over-etching is used to ensure that all the contact holes are etched. As such, the underlying insulating layer will inevitably be etched, making the final contact hole deep and the sidewall angle steep, which impacts an electrical connection between a pixel electrode and the drain electrode, thereby impacting the display effect. On the other hand, the problem of over-etching the underlying insulating layer can be prevented by reducing the area of the hole bottom of the contact hole of the passivation layer while reducing the area of the drain electrode hole bottom However, the contact hole having a small diameter is difficult to etch, and it is also easy to cause abnormal etching and impact the electrical connection between the pixel electrode and the drain electrode, thereby impacting the display effect.

Based on the existing problems, there is an urgent need to develop a new solution that the aperture ratio of the display panel can be increased without causing poor display.

SUMMARY OF INVENTION

Embodiments of the present application provide a display panel, a manufacturing method thereof, and a display device, so as to solve the technical problem of low aperture ratio of the existing display panel.

In order to solve the above problems, the technical solutions provided by the present application are as follows:

An embodiment of the present application provides a display panel, and the display panel includes:
 a substrate;
 a gate layer disposed on the substrate;
 a gate insulating layer disposed on the gate layer;
 an active layer disposed on the gate insulating layer;
 a source-drain layer disposed on the active layer and including a source electrode and a drain electrode;
 a passivation layer is disposed on the source-drain layer and defined with a contact hole; and
 a pixel electrode layer disposed on the passivation layer and connected to the drain electrode through the contact hole,
 wherein a light-transmitting etch stop layer is disposed at a hole bottom of the contact hole, and the light-transmitting etch stop layer at least partially covers a hole bottom of the contact hole.

In one embodiment, the etch stop layer and the active layer are disposed in a same layer.

In one embodiment, the etch stop layer is connected to the active layer.

In one embodiment, the etch stop layer is spaced apart from the active layer.

In one embodiment, a space between the etch stop layer and the active layer is filled with the drain electrode.

In one embodiment, a material of the active layer is selected from one of oxide semiconductor material, low-temperature polysilicon, and amorphous silicon.

In one embodiment, the oxide semiconductor material is indium gallium tin oxide.

In one embodiment, the hole bottom of the contact hole is covered by both the etch stop layer and the drain electrode.

In one embodiment, an area of the hole bottom of the contact hole that is covered by the etch stop layer is larger than an area of the hole bottom of the contact hole that is covered by the drain electrode.

In one embodiment, the hole bottom of the contact hole is completely covered by the etch stop layer, and the pixel electrode layer is connected to a sidewall of the drain electrode.

An embodiment of the present application also provides a method of manufacturing a display panel, the manufacturing method includes:
 S10: providing a substrate, wherein a gate layer, a gate insulating layer, an active layer, an etch stop layer, and a source-drain layer are sequentially formed on the substrate, and the source-drain layer includes a source electrode and a drain electrode;
 S20: forming a passivation layer on the source-drain layer, wherein the passivation layer is formed with a contact hole, and a hole bottom of the contact hole is at least partially covered by the etch stop layer; and
 S30: forming a pixel electrode layer on the passivation layer, wherein the pixel electrode layer is connected to the drain electrode and the etch stop layer through the contact hole.

In one embodiment, in the step S10, the active layer and the etch stop layer are formed by a same process.

An embodiment of the present application also provides a display device, including a display panel and a device main body, the device main body and the display panel being assembled into a unitary piece;
 wherein the display panel includes:
 a substrate;
 a gate layer disposed on the substrate;
 a gate insulating layer disposed on the gate layer;
 an active layer disposed on the gate insulating layer;
 a source-drain layer disposed on the active layer and including a source electrode and a drain electrode;
 a passivation layer is disposed on the source-drain layer and defined with a contact hole; and
 a pixel electrode layer disposed on the passivation layer and connected to the drain electrode through the contact hole, wherein a light-transmitting etch stop layer is disposed at a hole bottom of the contact hole, and the light-transmitting etch stop layer at least partially covers a hole bottom of the contact hole.

In one embodiment, the etch stop layer and the active layer are disposed in a same layer.

In one embodiment, the etch stop layer is connected to the active layer.

In one embodiment, the etch stop layer is spaced apart from the active layer.

In one embodiment, a material of the active layer is selected from one of oxide semiconductor material, low-temperature polysilicon, and amorphous silicon.

In one embodiment, the hole bottom of the contact hole is covered by both the etch stop layer and the drain electrode.

In one embodiment, an area of the hole bottom of the contact hole that is covered by the etch stop layer is larger than an area of the hole bottom of the contact hole that is covered by the drain electrode.

In one embodiment, the hole bottom of the contact hole is completely covered by the etch stop layer, and the pixel electrode layer is connected to a sidewall of the drain electrode.

In order to increase an aperture ratio of a display panel, the drain electrode having a reduced an area fails to cover or completely cover a hole bottom of a contact hole. Therefore, a light-transmitting etch stop layer is introduced to provide a barrier effect to ensure that a gate insulating layer under a first passivation layer is not etched during etching of the first passivation to form the contact hole, so that the formed contact hole has a better topography, that is, a depth of the contact hole becomes shallower and an angle of a sidewall of the contact hole becomes gentler. As such, a portion of the pixel electrode layer covering the sidewall of the contact hole forms a continuous film with a uniform thickness, so that the pixel electrode layer and the drain electrode can achieve better connection, which effectively prevents abnormal display due to poor connection, thereby improving a display yield and reliability of the display panel.

BRIEF DESCRIPTION OF DRAWINGS

FIG. 9 is a schematic diagram of a text flow chart of a method of manufacturing a display panel provided by an embodiment of the present application.

FIGS. 10a-101 are schematic structural flowcharts of a method of manufacturing a display panel provided by an embodiment of the present application.

DETAILED DESCRIPTION OF PREFERRED EMBODIMENTS

Figure 1:
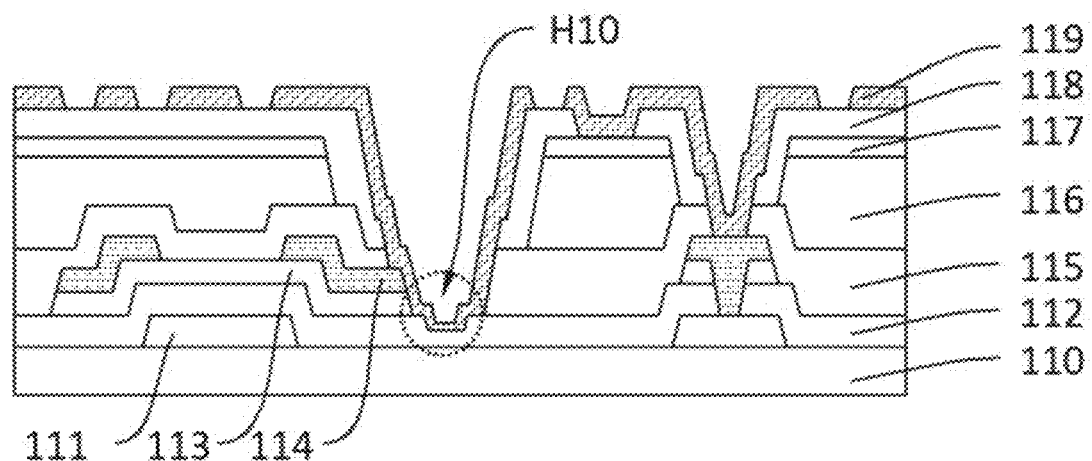
FIG. 1 is a schematic diagram of a cross-sectional structure of a display panel provided by the prior art of the present application.

Referring to the figures in the drawings, in which, like numbers refer to like elements throughout the description of the figures. Hereinafter, the present application will be described in further detail with reference to examples. It is to be understood, however, that these examples are for illustrative purposes only and are not intended to limit the scope of the present application.

In the description of the present application, it is to be understood that the terms "center", "longitudinal", "transverse", "length", "width", "thickness", "upper", "lower", "front", "post", "left", "right", "vertical", "horizontal", "top", "hole bottom", "inside", "outside", etc. demonstrating the orientation or positional relationship of the indications is based on the orientation shown in the drawings Or, the positional relationship is merely for the convenience of the description of the present application and the simplification of the description, and is not intended to imply that the device or the component of the present application has a specific orientation and is constructed and operated in a specific orientation, thus being not to be construed as limiting the present application. Moreover, the terms "first" and "second" are used for descriptive purposes only and are not to be construed as indicating or implying a relative importance or not to implicitly indicate a number of technical features indicated. Thus, features defined by "first" or "second" may include one or more of the described features either explicitly or implicitly. In the description of the present application, the meaning of "a plurality" is two or more unless specifically defined otherwise.

In the present application, the term "exemplary" is used to mean "serving as an example, illustration, or description." Any embodiment described as "exemplary" in the present application is not necessarily to be construed as preferred or advantageous over other embodiments. In order to enable any person skilled in the art to implement and use the present application, the following description is given. In the following description, details are set forth for the purpose of explanation. It should be understood by one of ordinary skill in the art that the present application may be implemented without the use of these specific details. In other embodiments, well-known structures and procedures are not described in detail to avoid obscuring the description of the present application with unnecessary details. Accordingly, the present application is not intended to be limited to the embodiments shown, but is to be accorded the widest scope consistent with the principles and features disclosed herein.

FIG. 1 shows a display panel in the prior art, which specifically includes a substrate 110, and a gate layer 111, a gate insulating layer 112, an active layer 113, a source-drain layer 114, a first passivation layer 115, a planarization layer 116, a common electrode layer 117, a second passivation layer 118, and a pixel electrode layer 119 stacked on the substrate 110 in sequence.

Figure 2:
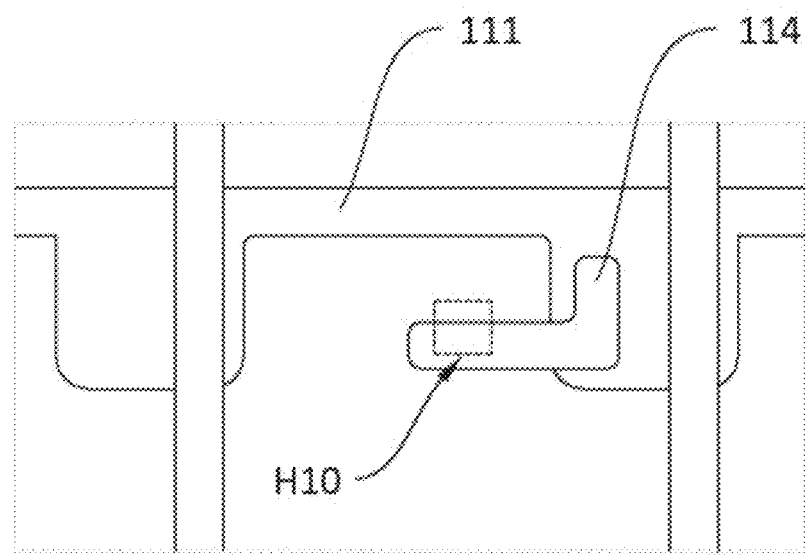
FIG. 2 is a schematic diagram of a planar structure layout of a partial area of a display panel provided by the prior art of the present application.

In this display panel, in order to increase an aperture ratio of the display panel, an area of the drain electrode in the source-drain layer 114 is reduced, so that a hole bottom of the contact hole H10 between the first passivation layer 115 and the second passivation layer 118 is not completely covered by the drain electrode. Specifically, referring to the schematic plan layout of the related structure shown in FIG. 2, when the contact hole is formed by etching, in order to ensure that all the contact holes are etched, the gate insulating layer 112 under the first passivation layer 115 will inevitably be over-etched, that is, a topography indicated by the circle in FIG. 2 is formed, so that the resulting contact hole is deep and its sidewall angle is steep, which is easy to cause the source-drain layer 114 covering the sidewall of the contact hole H10 to become thinner or even break, which impacts the electrical connection between the pixel electrode layer and the drain electrode, resulting in poor display.

Figure 3:
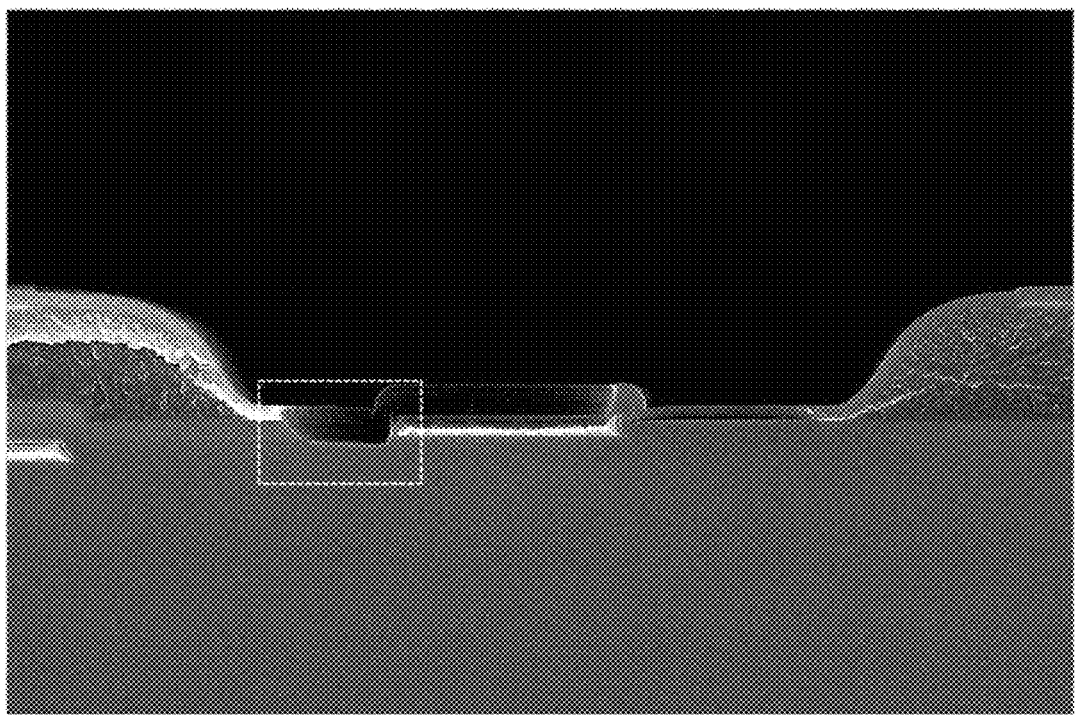
FIG. 3 is a schematic diagram of a microscopic topography of an abnormal etching phenomenon of a gate insulating layer in a display panel provided by the prior art of the present application.

A schematic diagram of a microscopic topography of an abnormal etching phenomenon of the gate insulating layer can be referred to FIG. 3, and the groove formed by the over-etching of the gate insulating layer is indicated by the box in FIG. 3.

Figure 4:
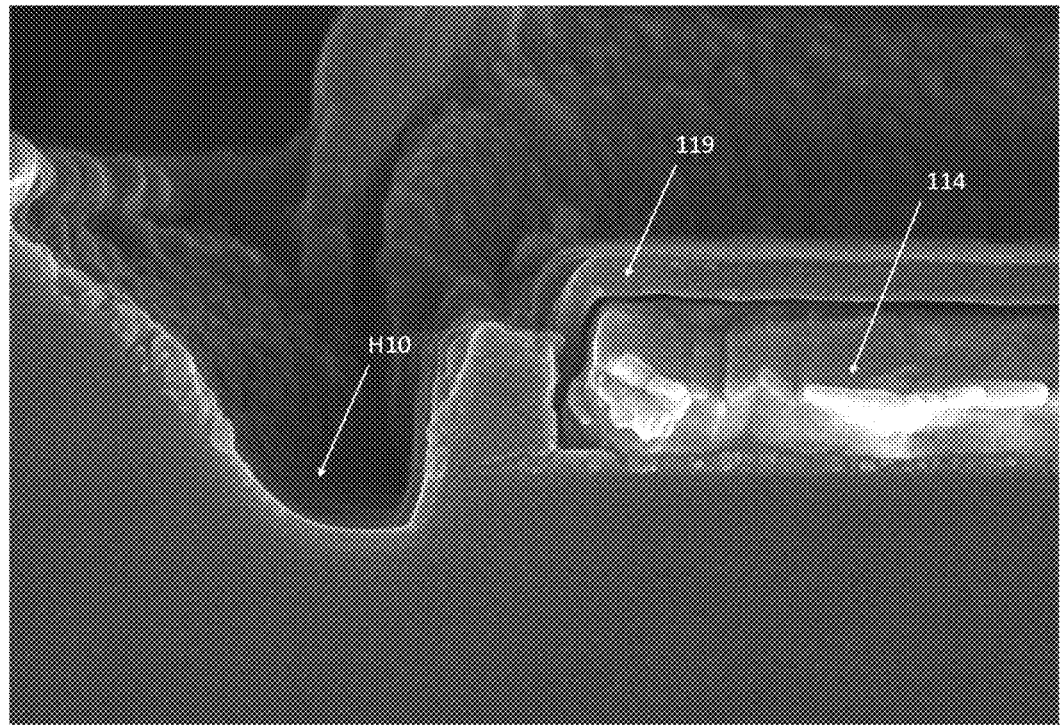
FIG. 4 is a schematic diagram of a microscopic topography of a pixel electrode and a drain electrode in a display panel provided by the prior art of the present application.

A schematic diagram of a microscopic topography of poor connection between the pixel electrode layer 119 and the source-drain layer 114 can be referred to FIG. 4, a film thickness of the pixel electrode layer 119 covering the sidewall of the contact hole H10 becomes thinner and even has a tendency to break, so that its electrical connection with the source-drain layer 114 may be abnormal.

In view of the foregoing problems, an embodiment of the present application provides a display panel, which will be described in detail below with reference to the schematic cross-sectional structure of the display panel shown in FIG. 5.

Specifically, the display panel includes a substrate 210, and a gate layer 211, a gate insulating layer 212, an active layer 213, a source-drain layer 214, a first passivation layer 215, and a pixel electrode layer 219 that are sequentially stacked on the substrate 210.

The source-drain layer 214 includes a source electrode 2141 and a drain electrode 2142, the first passivation layer 215 is provided with a through contact hole H20, and the pixel electrode layer 219 is connected to the drain electrode 2142 through the contact hole H20.

Further, a hole bottom of the contact hole H20 is provided with a light-transmitting etch stop layer 220, and the light-transmitting etch stop layer 220 at least partially covers the hole bottom of the contact hole H20.

In the display panel provided by the embodiment, the drain electrode 2142 does not cover or completely cover the hole bottom of the contact hole H20, so that the area of the drain electrode 2142 can be reduced, thereby increasing an aperture ratio of the display panel. Meanwhile, the uncovered part of the hole bottom of the contact hole H20 is covered by the additional light-transmitting etch stop layer 220. The light-transmitting etch stop layer 220 is introduced to provide a barrier effect to ensure that a gate insulating layer 212 under a first passivation layer 215 is not etched during etching of the first passivation 215 to form the contact hole H20, so that the formed contact hole H20 has a better topography, that is, a depth of the contact hole becomes shallower and an angle of a sidewall of the contact hole becomes gentler. As such, a portion of the pixel electrode layer 219 covering the sidewall of the contact hole H20 forms a film with a uniform thickness, so that the pixel electrode layer 219 and the drain electrode 2142 can achieve better connection, which effectively prevents abnormal display due to poor connection, thereby improving a display yield and reliability of the display panel.

It is supplemented that the light-transmitting etch stop layer 220 is made of a material with higher light transmittance, and introduction of this structure will not cause a loss of the aperture ratio of the display panel. Meanwhile, a material of the light-transmitting etch stop layer 220 is different from a material of the first passivation layer 215, there is a higher etching selectivity between the material of the light-transmitting etch stop layer 220 and the material of the first passivation layer. When the first passivation layer 215 is etched, the light-transmitting etch stop layer 220 will not be etched or barely etched, thereby providing an etch stop effect.

Figure 5:
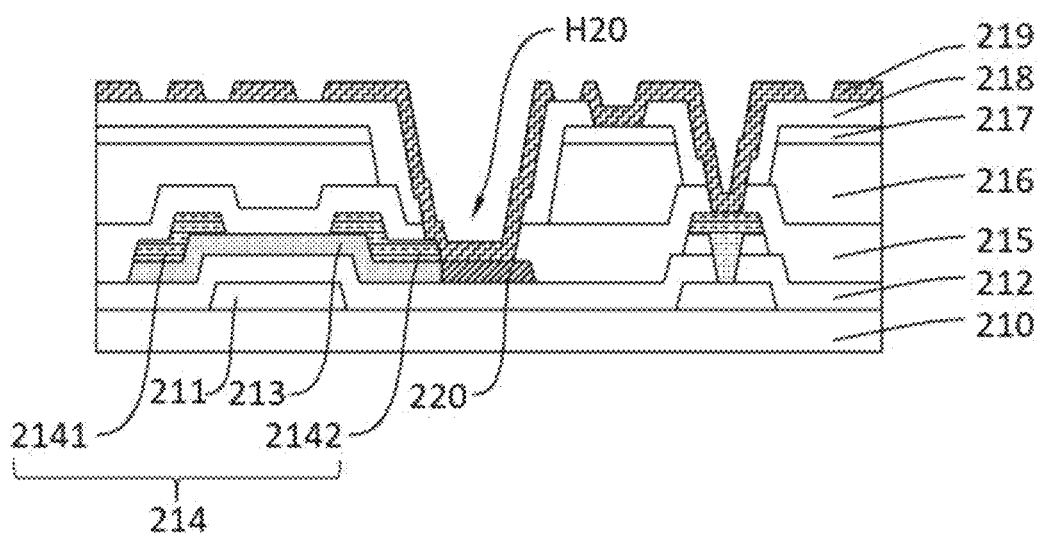
FIG. 5 is a schematic diagram of a cross-sectional structure of a first display panel provided by an embodiment of the present application.

The light-transmitting etch stop layer 220 may be disposed under, above, or adjacent to the drain electrode 2142, and FIG. 5 only exemplarily shows one situation that the light-transmitting etch stop layer is disposed under the drain electrode 2142.

In addition, the display panel provided in this embodiment usually further includes a planarization layer 116, a common electrode layer 117, and a second passivation layer 118 disposed between the first passivation layer 215 and the pixel electrode layer 219. The contact hole H20 is specifically a through hole defined in the first passivation layer 215 and the second passivation layer 118.

Of course, in addition to the structure described above, the display panel provided by an embodiment of the present application may also include any other necessary structures as required, such as a liquid crystal layer, a color filter layer, etc., which are not specifically limited herein.

In some embodiments, in order to further simplify the structure and manufacturing process of the display panel, the light-transmitting etch stop layer 220 may be arranged in the same layer as the existing structural layer in the display panel. For example, referring to another schematic diagram of the cross-sectional structure of the display panel shown in FIG. 6, the light-transmitting etch stop layer 220 and the active layer 213 are arranged in the same layer, that is, the light-transmitting etch stop layer 220 and the active layer 213 are formed by the same process. Details can be referred to embodiments of the manufacturing process of the display panel described later.

Figure 6:
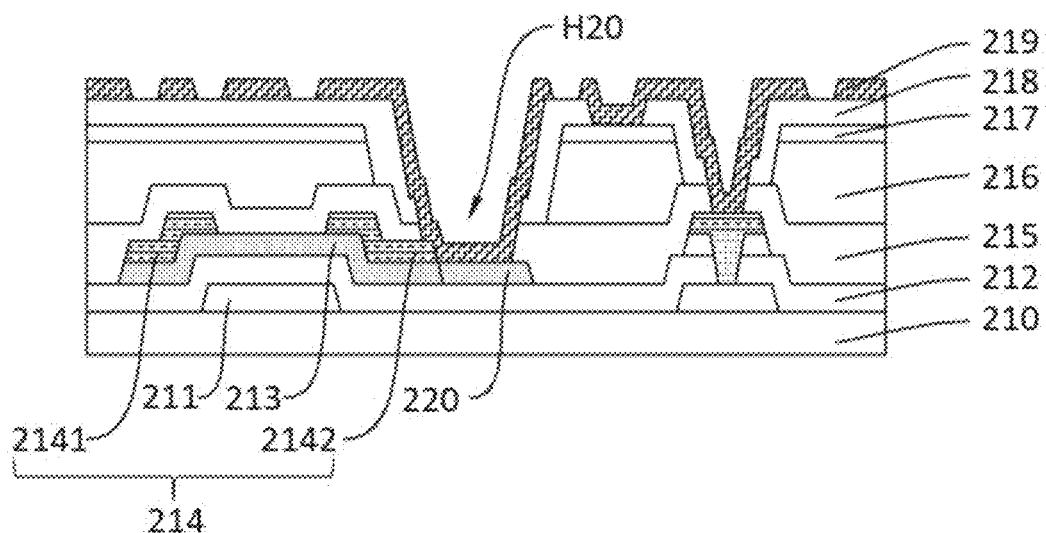
FIG. 6 is a schematic diagram of a cross-sectional structure of a second display panel provided by an embodiment of the present application.
Figure 7:
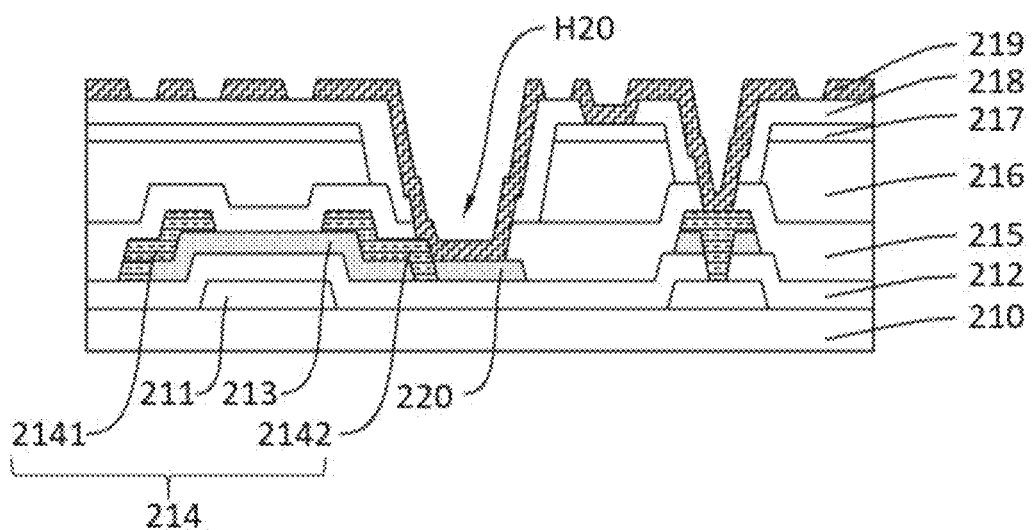
FIG. 7 is a schematic cross-sectional structure diagram of a third display panel provided by an embodiment of the present application.

Further, the etch stop layer 220 is connected to the active layer 213, that is, the structure shown in FIG. 6, the etch stop layer 220 and the active layer 213 are formed as a unitary piece; in another case, the etch stop layer 220 and the active layer 213 are spaced apart from each other, that is, the structure shown in FIG. 7, and the space portion is filled by the drain electrode 2142.

Material of each of the etch stop layer 220 and the active layer 213 is selected from one of oxide semiconductor material, low-temperature polysilicon and amorphous silicon.

All of the aforementioned materials not only have a higher etching selectivity with the passivation layer material (usually silicon oxide or silicon nitride), so as to achieve an etch stop effect, but also have a higher light transmittance and do not cause a loss to the aperture ratio of the display panel. Specifically, the oxide semiconductor material may be indium gallium zinc oxide or other oxide semiconductor materials commonly used in the art.

In some embodiments, the hole bottom of the contact hole H20 is covered by both the etch stop layer 220 and the drain electrode 2142. Furthermore, since the contact hole H20 should not be designed to be too small to ensure that the formed contact hole H20 has a better topography, the hole bottom of the contact hole H20 can be more covered by the etch stop layer 220, that is, the area of the hole bottom of the contact hole H20 covered by the etch stop layer 220 is larger than the area of the hole bottom of the contact hole H20 covered by the drain electrode 2142, thereby facilitating a higher aperture ratio of the display panel.

Figure 8:
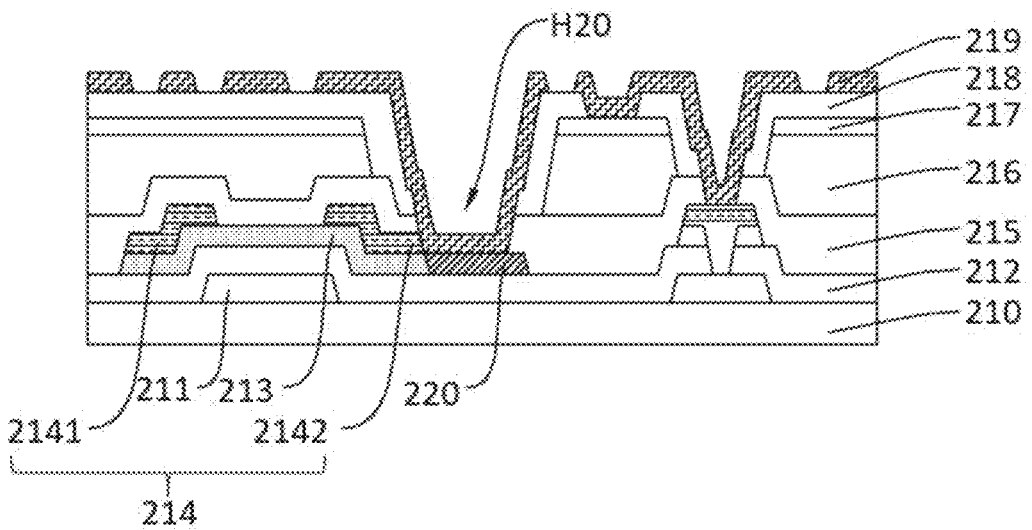
FIG. 8 is a schematic diagram of a cross-sectional structure of a fourth display panel provided by an embodiment of the present application.

In some embodiments, the hole bottom of the contact hole H20 is completely covered by the etch stop layer 220, so that the pixel electrode layer 219 is only connected to the sidewall of the drain electrode 2142, that is, the structure shown in FIG. 8, which can maximize the aperture ratio of the display panel.

Another embodiment of the present application also provides a method of manufacturing a display panel, and the manufacturing process can be referred to FIG. 9, which specifically includes the following steps:

S10: providing a substrate, wherein a gate layer, a gate insulating layer, an active layer, an etch stop layer, and a source-drain layer are sequentially formed on the substrate, and the source-drain layer includes a source electrode and a drain electrode;

S20: forming a passivation layer on the source-drain layer, wherein the passivation layer is formed with a contact hole, and a hole bottom of the contact hole is at least partially covered by the etch stop layer; and S30: forming a pixel electrode layer on the passivation layer, wherein the pixel electrode layer is connected to the drain electrode and the etch stop layer through the contact hole.

The specific structure of the prepared display panel can be referred to the foregoing embodiments of the display panel. In this manufacturing method, the etch stop layer is formed to at least partially cover the hole bottom of the contact hole, and the etch stop layer provides a barrier effect to ensure that a gate insulating layer under a first passivation layer is not etched during etching of the first passivation to form the contact hole, so that the formed contact hole has a better topography, that is, a depth of the contact hole becomes shallower and an angle of a sidewall of the contact hole becomes gentler. As such, a portion of the pixel electrode layer coving the sidewall of the contact hole forms a film with a uniform thickness, so that the pixel electrode layer and the drain electrode can achieve better connection, which effectively prevents abnormal display due to poor connection, thereby improving a display yield and reliability of the display panel.

In some embodiments, in the step S10, the active layer and the etch stop layer are formed by the same manufacturing process, which can achieve improvement without increasing the display panel manufacturing process, and detailed description can be referred to FIGS. 10a-10k.

Figure 10A:
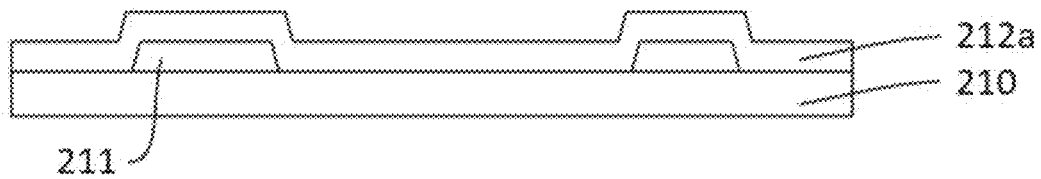

A substrate 210 is provided, and a gate layer 211 and a first insulating material film 212a are formed on the substrate 210, thus forming a structure as shown in FIG. 10a.

Figure 10B:
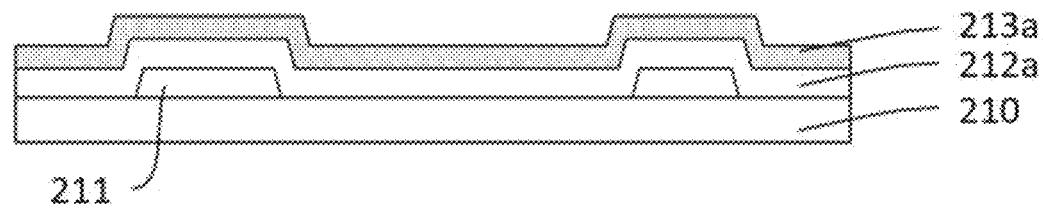

A semiconductor material layer 213a is formed on the first insulating material layer 212a, thus forming a structure as shown in FIG. 10b.

Figure 10C:
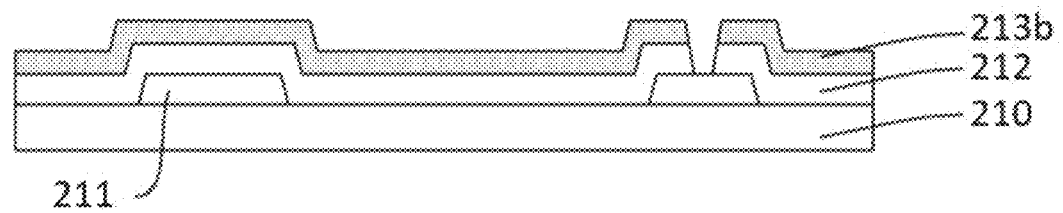

The first insulating material layer 212a and the semiconductor material layer 213a are patterned, and a through hole is formed at a position corresponding the pattern to form the gate insulating layer 212 and the first intermediate layer 213b of the semiconductor material layer, thus forming a structure as shown in FIG. 10c.

Figure 10D:
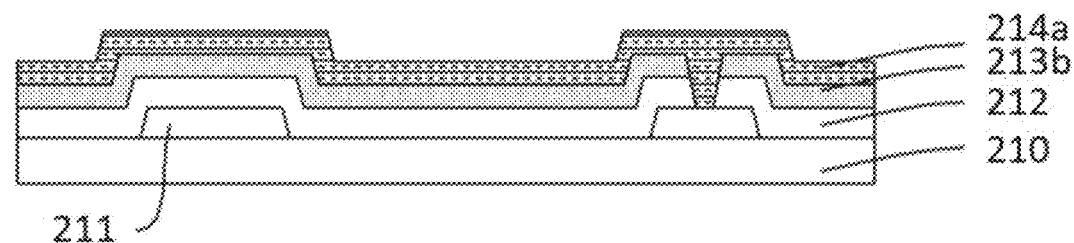

A metal material layer 214a is formed on the first intermediate layer 213b of the semiconductor material layer, thus forming a structure as shown in FIG. 10d.

Figure 10E:
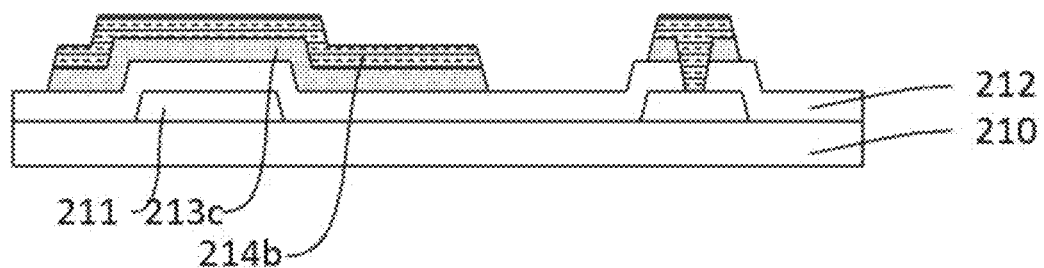

The first intermediate layer 213b of the semiconductor material layer and the metal material layer 214a are patterned to form a second intermediate layer 213c of the semiconductor material layer and an intermediate layer 214b of the metal material layer, thus forming a structure as shown in FIG. 10e.

Figure 10F:
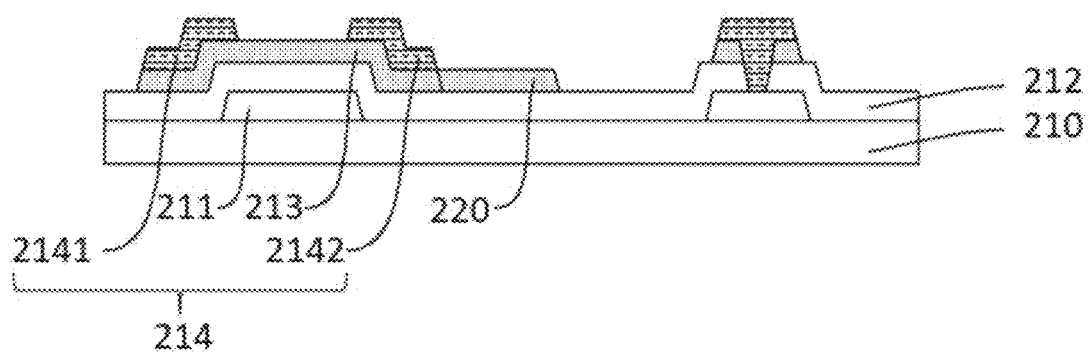

The intermediate layer 214b of the metal material layer is patterned to form a source-drain layer 214, including a source electrode 2141 and a drain electrode 2142, so that the second intermediate layer 213c of the underlying semiconductor material layer is divided into an active layer 213 and an etch stop layer 220, and the etch stop layer 220 is an area adjacent to the active layer 213 that is not covered by the drain electrode, thus forming a structure as shown in FIG. 10f.

Figure 10G:
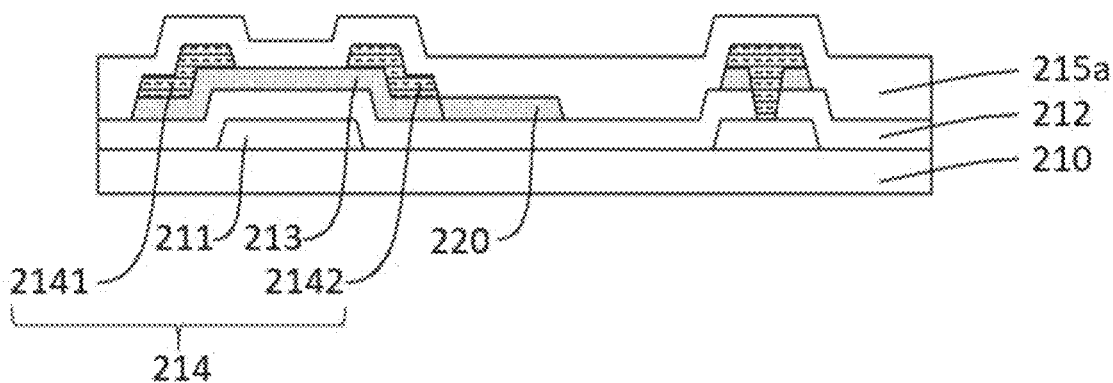

A second insulating material layer 215a is formed on the source-drain layer 214, thus forming a structure as shown in FIG. 10g.

Figure 10H:
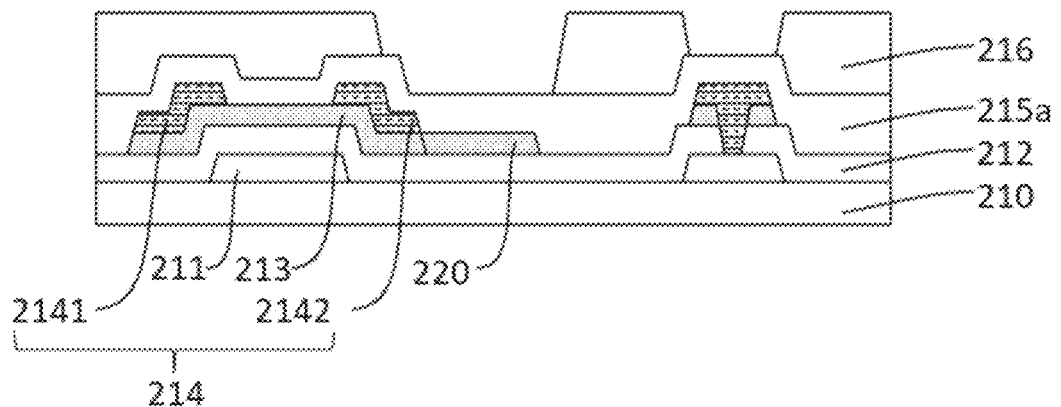

A planarization layer 216 is formed on the second insulating material layer 215a, thus forming a structure as shown in FIG. 10h.

Figure 10I:
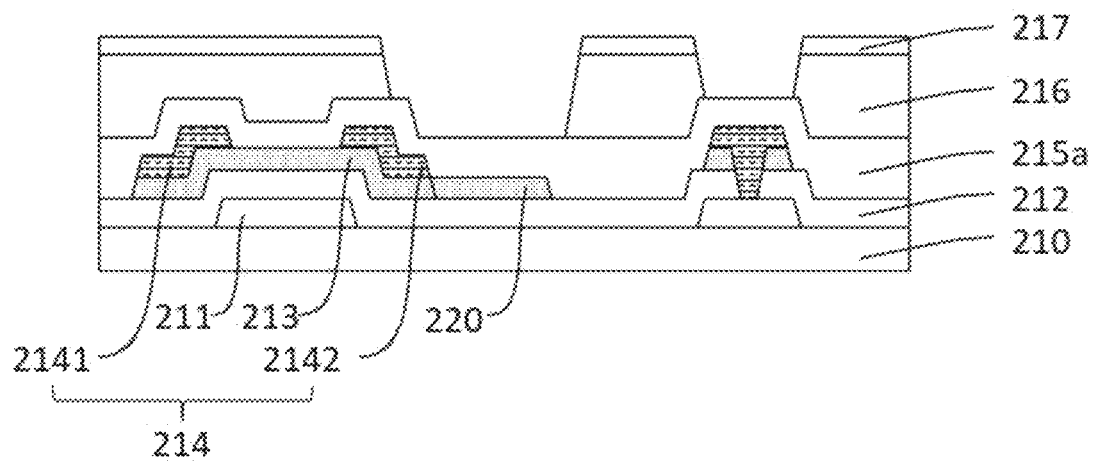

A common electrode layer 217 is formed on the planarization layer 216, thus forming a structure as shown in FIG. 10i.

Figure 10J:
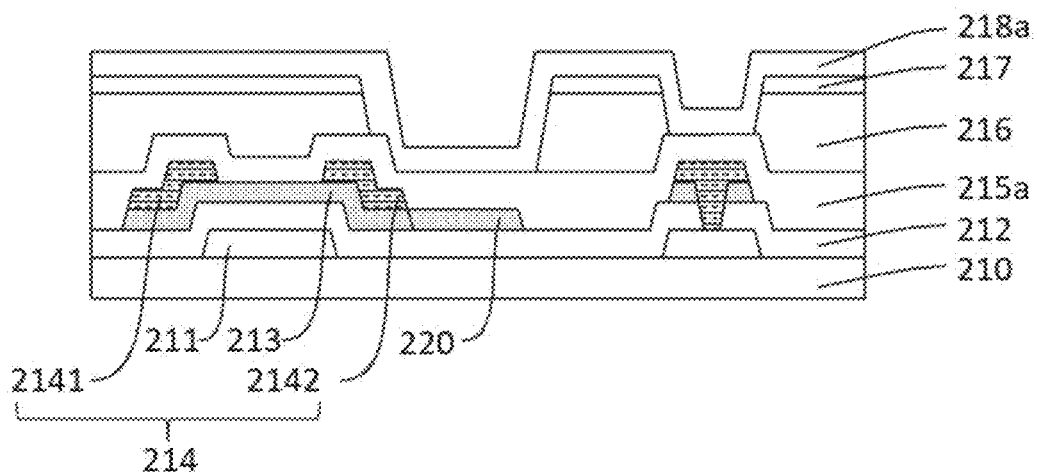

A third insulating material layer 218a is formed on the common electrode layer 217, thus forming a structure as shown in FIG. 10j.

Figure 10K:
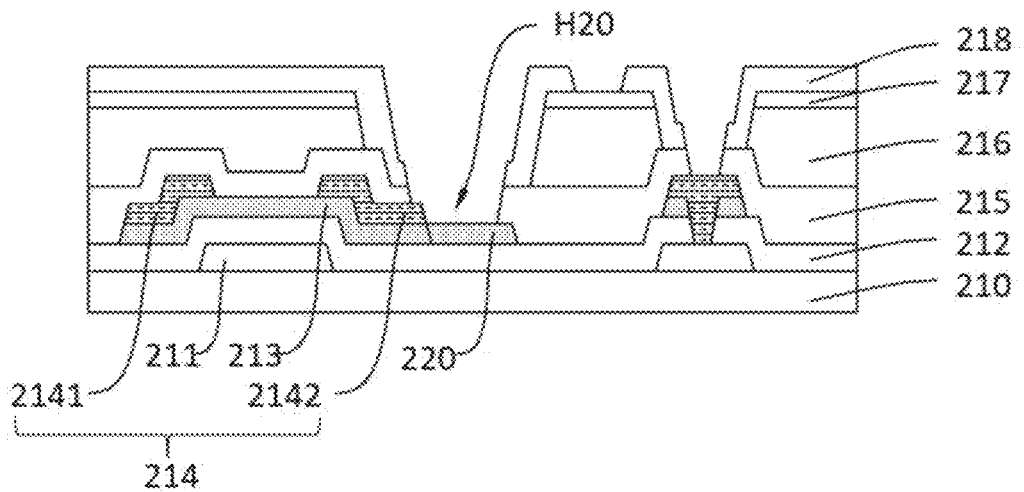

The second insulating material layer 215a and the third insulating material layer 218a are patterned to form a contact hole H20, and then a first passivation layer 215 and a second passivation layer 218 are formed, thus forming a structure as shown in FIG. 10k. The hole bottom of the contact hole H20 is covered by the drain electrode 2142 and the etch stop layer 220.

Figure 10L:
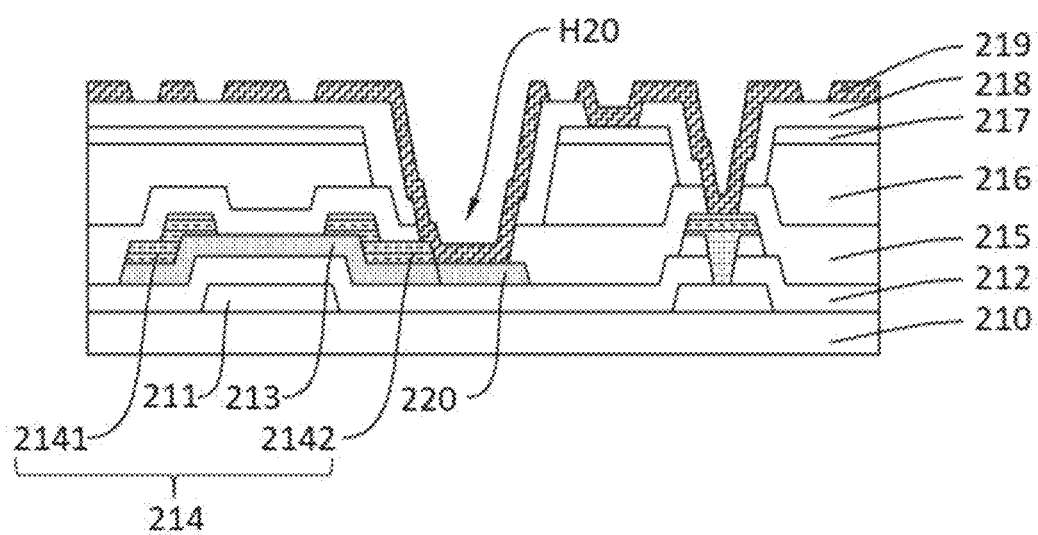

A pixel electrode layer 219 is formed on the second passivation layer 218, and the pixel electrode layer 219 is connected to the drain electrode 2142 through the contact hole H20, thus completing the manufacturing and forming a structure as shown in FIG. 10l.

It is supplemented that the above-mentioned patterning process of the active layer and the source-drain layer can be completed with a halftone mask, so as to further save the manufacturing process.

Another embodiment of the present application also provides a display device. The display device includes the display panel and the device main body described in the previous embodiments. The device main body and the display panel are assembled into a unitary piece. The device main body may include an outer frame, sealant, etc., and the display device may be an existing conventional display device such as a mobile phone, a tablet, a television, etc., which is not particularly limited in the embodiments of the present application.

In the above embodiments, the descriptions of each embodiment have their own emphasis. The parts that are not described in detail in an embodiment can be referred to the detailed descriptions in other embodiments above, which will not be repeated herein for brevity.

The display panel, the manufacturing method thereof, and the display device provided by the embodiments of the present application are described in detail above. Specific examples are used in this document to explain the principles and implementation of the present application. The descriptions of the above embodiments are only for understanding the method of the present application and its core idea; Meanwhile, for those skilled in the art, according to the idea of the present application, there will be changes in the specific implementation and application scope. In summary, the content of this specification should not be construed as a limitation on the present application.

What is claimed is:

1. A display panel, wherein the display panel comprises:
a substrate;
a gate layer disposed on the substrate;
a gate insulating layer disposed on the gate layer;
an active layer disposed on the gate insulating layer;
a source-drain layer disposed on the active layer and comprising a source electrode and a drain electrode;
a passivation layer is disposed on the source-drain layer and defined with a contact hole; and
a pixel electrode layer disposed on the passivation layer and connected to the drain electrode through the contact hole,
wherein a light-transmitting etch stop layer is disposed at a bottom of the contact hole, and the light-transmitting etch stop layer at least partially covers a hole bottom of the contact hole,
the etch stop layer and the active layer are disposed in a same layer, and the etch stop layer is spaced apart from the active layer.

2. The display panel according to claim 1, wherein a space between the etch stop layer and the active layer is filled with the drain electrode.

3. The display panel according to claim 1, wherein a material of the active layer is selected from one of oxide semiconductor material, low-temperature polysilicon, and amorphous silicon.

4. The display panel according to claim 3, wherein the oxide semiconductor material is indium gallium tin oxide.

5. The display panel according to claim 1, wherein the hole bottom of the contact hole is covered by both the etch stop layer and the drain electrode.

6. The display panel according to claim 5, wherein an area of the hole bottom of the contact hole that is covered by the etch stop layer is larger than an area of the hole bottom of the contact hole that is covered by the drain electrode.

7. The display panel according to claim 1, wherein the hole bottom of the contact hole is completely covered by the etch stop layer, and the pixel electrode layer is connected to a sidewall of the drain electrode.

8. A method of manufacturing a display panel, wherein the manufacturing method comprises the following steps:
S10: providing a substrate, wherein a gate layer, a gate insulating layer, an active layer, an etch stop layer, and a source-drain layer are sequentially formed on the substrate, and the source-drain layer comprises a source electrode and a drain electrode;
S20: forming a passivation layer on the source-drain layer, wherein the passivation layer is formed with a contact hole, and a hole bottom of the contact hole is at least partially covered by the etch stop layer; and
S30: forming a pixel electrode layer on the passivation layer, wherein the pixel electrode layer is connected to the drain electrode and the etch stop layer through the contact hole, wherein the etch stop layer and the active layer are disposed in a same layer, and the etch stop layer is spaced apart from the active layer.

9. The method of manufacturing a display panel according to claim 8, wherein in the step S10, the active layer and the etch stop layer are formed by a same process.

10. A display device, comprising a display panel and a device main body, the device main body and the display panel being assembled into a unitary piece;
wherein the display panel comprises:
a substrate;
a gate layer disposed on the substrate;
a gate insulating layer disposed on the gate layer;
an active layer disposed on the gate insulating layer;
a source-drain layer disposed on the active layer and comprising a source electrode and a drain electrode;
a passivation layer is disposed on the source-drain layer and defined with a contact hole; and
a pixel electrode layer disposed on the passivation layer and connected to the drain electrode through the contact hole,
wherein a light-transmitting etch stop layer is disposed at a bottom of the contact hole, and the light-transmitting etch stop layer at least partially covers a hole bottom of the contact hole,
the etch stop layer and the active layer are disposed in a same layer, and the etch stop layer is spaced apart from the active layer.

11. The display device according to claim 10, wherein a material of the active layer is selected from one of oxide semiconductor material, low-temperature polysilicon, and amorphous silicon.

12. The display device according to claim 10, wherein the hole bottom of the contact hole is covered by both the etch stop layer and the drain electrode.

13. The display device according to claim 12, wherein an area of the hole bottom of the contact hole that is covered by the etch stop layer is larger than an area of the hole bottom of the contact hole that is covered by the drain electrode.

14. The display device according to claim 10, wherein the hole bottom of the contact hole is completely covered by the etch stop layer, and the pixel electrode layer is connected to a sidewall of the drain electrode.

* * * * *